US005739800A

United States Patent [19]
Lebby et al.

[11] Patent Number: 5,739,800
[45] Date of Patent: *Apr. 14, 1998

[54] INTEGRATED ELECTRO-OPTICAL PACKAGE WITH LED DISPLAY CHIP AND SUBSTRATE WITH DRIVERS AND CENTRAL OPENING

[75] Inventors: Michael S. Lebby, Apache Junction; John W. Stafford, Phoenix; Fred V. Richard, Scottsdale, all of Ariz.

[73] Assignee: Motorola, Schaumburg, Ill.

[*] Notice: The term of this patent shall not extend beyond the expiration date of Pat. No. 5,432,358.

[21] Appl. No.: 610,506

[22] Filed: Mar. 4, 1996

[51] Int. Cl.[6] .............................. G09G 3/32; G09G 5/00; H01L 27/15
[52] U.S. Cl. ...................... 345/82; 345/206; 257/81
[58] Field of Search ............................ 345/205, 206, 345/82; 257/72, 81; 349/58; 359/811

[56] References Cited

U.S. PATENT DOCUMENTS

| 5,432,358 | 7/1995 | Nelson et al. | 257/81 |
| 5,467,215 | 11/1995 | Lebby et al. | 349/58 |
| 5,612,549 | 3/1997 | Nelson et al. | 257/72 |
| 5,621,225 | 4/1997 | Shieh et al. | 257/81 |

Primary Examiner—Steven Saras
Assistant Examiner—Paul A. Bell
Attorney, Agent, or Firm—Eugene A. Parsons

[57] ABSTRACT

An integrated electro-optical package (50) including a light emitting device (LED) display chip (14), with an array (15) of light emitting devices (LEDs) (12) formed thereon and cooperating to generate a complete image. The LEDs (12) are positioned in rows and columns and connected to connection/mounting pads (22) adjacent outer edges of the chip (14). An opaque mounting substrate (30) having a central opening (35). A driver substrate (55) having mounting pads (34), bump bonded to a plurality of pads (33) and (34) on the mounting substrate (30). A plurality of driver circuits (57) connected to the LEDs (12) through terminals on the driver substrate (55). A lens (60) mounted to the mounting substrate (30) over the array (15) of LEDs (12) and on a side opposite the LED display chip (14) to magnify, or serve as one element of an optical magnifier system, the complete image and produce an easily viewable virtual image.

46 Claims, 8 Drawing Sheets

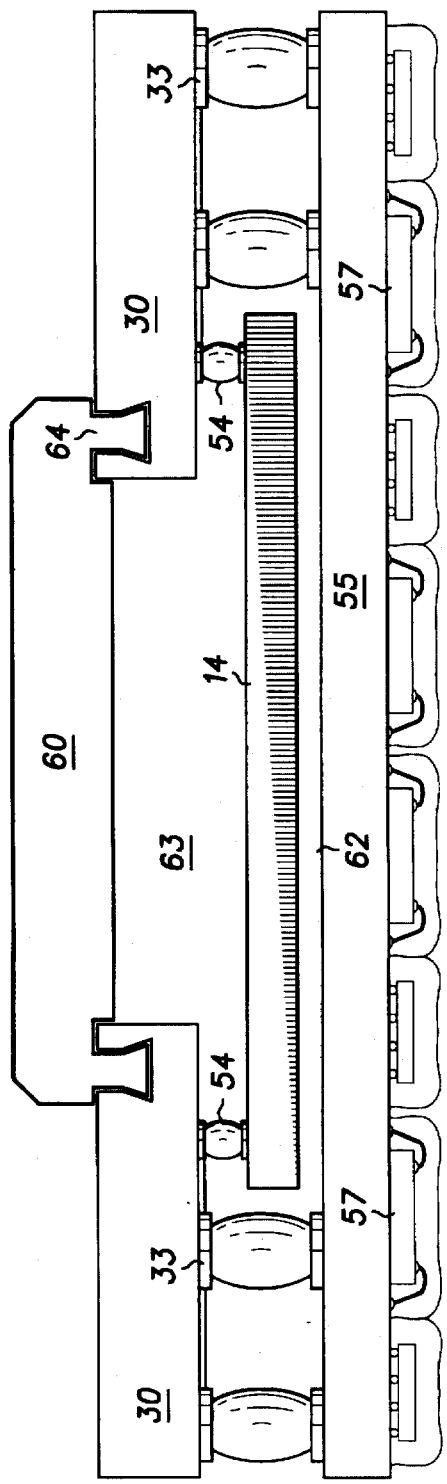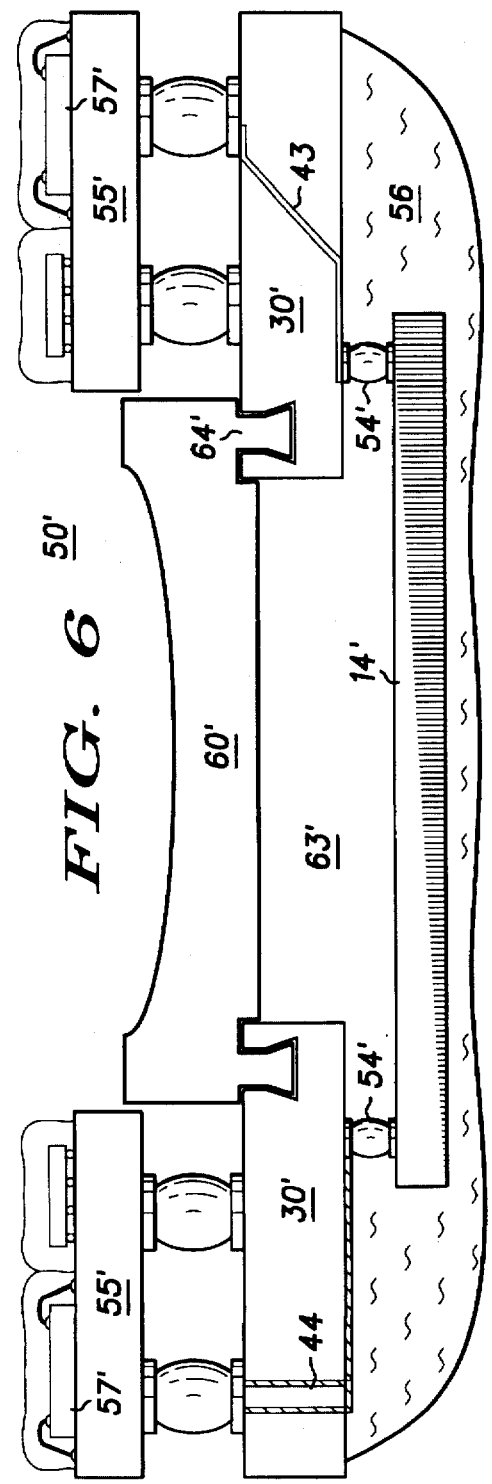

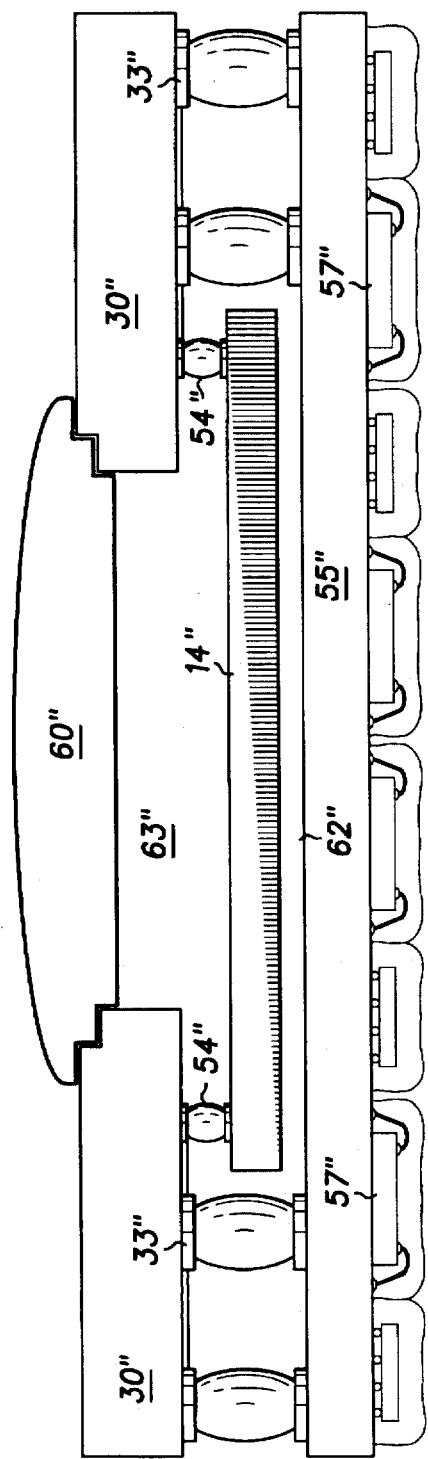
*FIG. 7* —PRIOR ART—
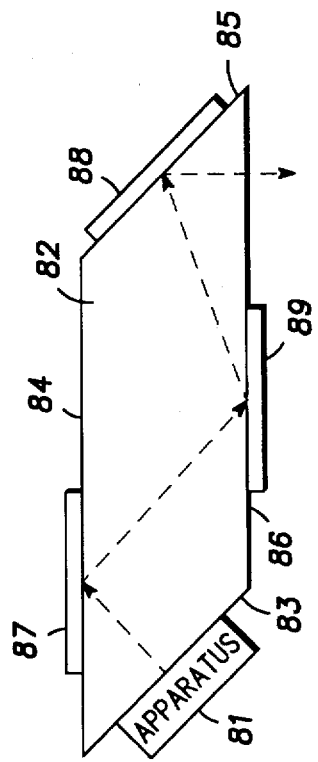
*FIG. 10* —PRIOR ART—
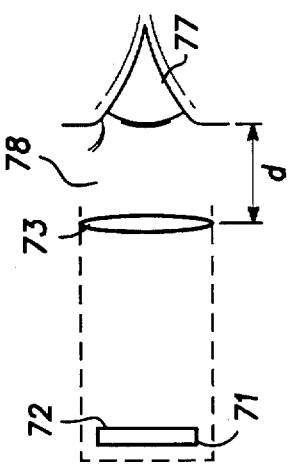
*FIG. 9* —PRIOR ART—

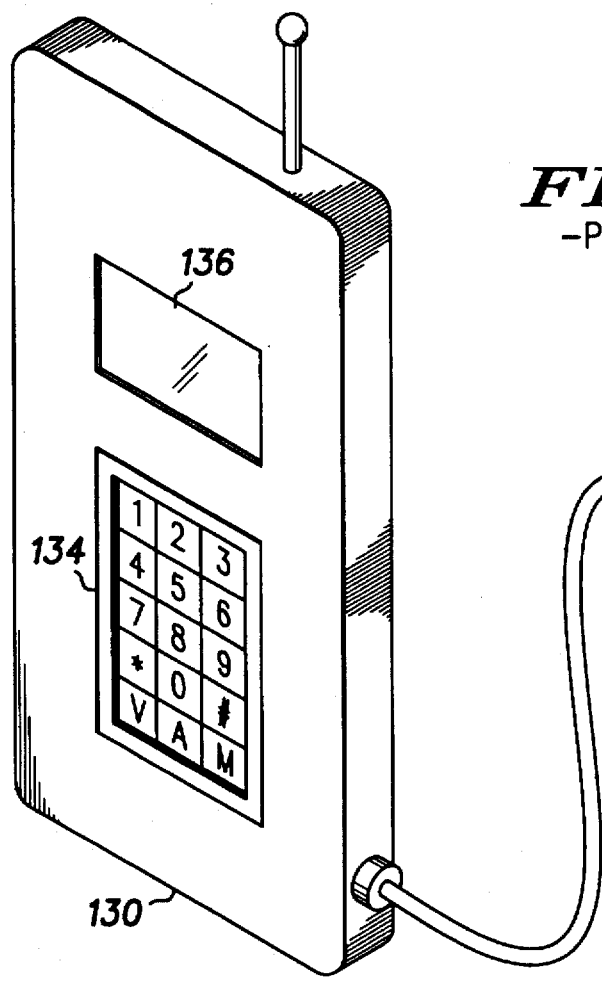
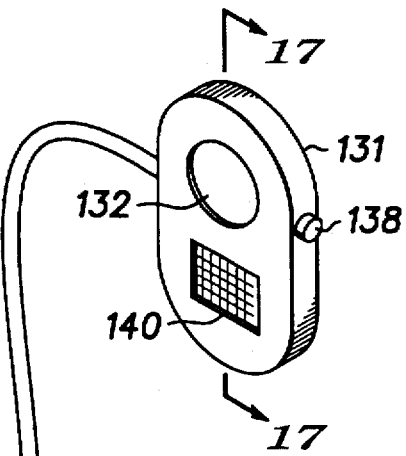
FIG. 16
-PRIOR ART-
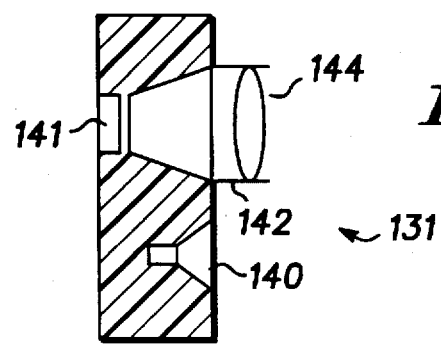
FIG. 17
-PRIOR ART-

INTEGRATED ELECTRO-OPTICAL PACKAGE WITH LED DISPLAY CHIP AND SUBSTRATE WITH DRIVERS AND CENTRAL OPENING

FIELD OF THE INVENTION

The present invention pertains to packages containing electrical and optical components connected in cooperation and more specifically to a package for electrically connecting optical components and driver circuits in electrical circuitry.

BACKGROUND OF THE INVENTION

Generally, a semiconductor substrate, or integrated circuit, is mounted on a printed circuit board or the like and the accepted method for connecting the substrate to external circuits is to use standard wire bond technology. However, when a semiconductor substrate having a relatively large array of electrical components or devices formed thereon is to be connected, standard wire bond techniques can become very difficult. For example, if a relatively large array (greater than, for example, 10,000 or 100×100) of light emitting diodes is formed on a substrate with a pitch (center-to-center separation) of P, then bond pads on the perimeter of the substrate will have a 2P pitch. This is true because every other row and every other column goes to an opposite edge of the perimeter to increase the distance between bond pads as much as possible.

At the present time wire bond interconnects from bond pads having a pitch of 4.8 milli-inches is the best that is feasible. Thus, in the array mentioned above of 100×100 light emitting diodes the bond pads on the perimeter of the light emitting device display chip would have a minimum pitch of 4.8 milli-inches, with 50 bond pads situated along each edge of the perimeter. As more devices are included in the array, more bond pads are required and the perimeter size to accommodate the additional bond pads increases at an even greater rate. That is, since the minimum pitch of the bonding pads is 4.8 milli-inches, the pitch of the devices in the array can be as large as 2.4 milli-inches, or approximately 61 microns, without effecting the size of the substrate. Thus, even if the devices can be fabricated smaller than 61 microns, the minimum pitch of the bonding pads will not allow the perimeter of the substrate to be made any smaller. It can quickly be seen that the size of the substrate is severely limited by the limitations of the wire bonding technology.

Further, it has been common practice to mount substrates and interface circuitry on a single board. The problem that arises is the large amount of surface area required to mount and connect various components.

Thus, there is a need for interconnect and packaging structures and techniques which can substantially reduce the limitation on size of substrate and which can reduce the amount of required surface area.

Accordingly, it is a purpose of the present invention to provide integrated electro-optical packages which are not limited in size by the electrical connections.

It is another purpose of the present invention to provide integrated electro-optical packages which are substantially smaller than previous integrated packages.

It is still another purpose of the present invention to provide integrated electro-optical packages which utilize low cost materials, translating to lower manufacturing costs.

It is yet another purpose of the present invention to provide integrated electro-optical packages that are simpler to assemble, thereby more amenable to high volume production.

SUMMARY OF THE INVENTION

The above problems and others are substantially solved and the above purposes and others are realized in an integrated electro-optical package including a light emitting device display chip having a major surface with an array of light emitting devices formed on the major surface at a central portion thereof and cooperating to generate a complete image. Each of the light emitting devices have first and second electrodes for activating the light emitting devices. The light emitting device display chip further has external connection/mounting pads adjacent outer edges thereof and outside of the central portion of the major surface with the first electrodes of the light emitting devices being connected to a first plurality of the external connection/mounting pads and the second electrodes of the light emitting devices being connected to a second plurality of the external connection/mounting pads. A mounting substrate has a major surface and defines a central opening therethrough substantially coextensive with the complete image at the central portion of the major surface of the light emitting device display chip. The mounting substrate further has a plurality of electrical conductors formed therein, each extending from a mounting pad adjacent an edge of the central opening to a connection pad on the major surface of the mounting substrate. The mounting substrate is formed of molded opaque plastic, ceramic, silicon, or some other suitable opaque material with a coefficient of thermal expansion (CTE) close to that of the light emitting device display chip, and defining a central opening therethrough with the electrical conductors formed as a frame around the opening.

During assembly the major surface of the light emitting device display chip is mounted on the major surface of the mounting substrate with the first and second pluralities of external connection/mounting pads being in electrical contact with the mounting pads of the mounting substrate and the complete image at the central portion of the major surface of the light emitting device display chip being axially aligned and substantially coextensive with the central opening in the major surface of the mounting substrate.

A driver substrate having a first major surface and a second opposed major surface is provided. A plurality of driver and controller circuits are mounted on the driver substrate and have data input terminals and further have control signal output terminals connected to the first and second terminals of the light emitting devices for activating the light emitting devices to generate complete images in accordance with data signals applied to the data input terminals.

In the preferred embodiment the external connection/mounting pads of the light emitting device display chip are bump bonded to the mounting pads adjacent an edge of the central opening of the mounting substrate to substantially reduce the allowable pitch of the connection/mounting pads. Also, the connection pads on the major surface of the mounting substrate are positioned into a matrix of rows and columns to allow a substantially greater number of connection pads in a substantially smaller surface area.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

FIG. 5 is an enlarged view of a first embodiment of an electro-optical package of the present invention, portions thereof broken away, assembled into a complete package;

FIG. 6 is an enlarged view of a second embodiment of an electro-optical package of the present invention, portions thereof broken away, assembled into a complete package;

FIG. 7 is an enlarged view of a third embodiment of an electro-optical package of the present, invention, portions thereof broken away, assembled into a complete package;

FIG. 9 is a simplified schematic view of a miniature virtual image display incorporating the package of FIG. 8;

FIGS. 10 and 11 are additional simplified schematic views, similar to FIG. 9, of other miniature virtual image displays incorporating the package of FIG. 8;

FIG. 16 is a view in perspective of a portable communications receiver incorporating the miniature virtual image display of FIG. 9;

FIG. 17 is a simplified view generally as seen from the line 17—17 of FIG. 16;

DESCRIPTION OF THE PREFERRED EMBODIMENT

Figure 1:
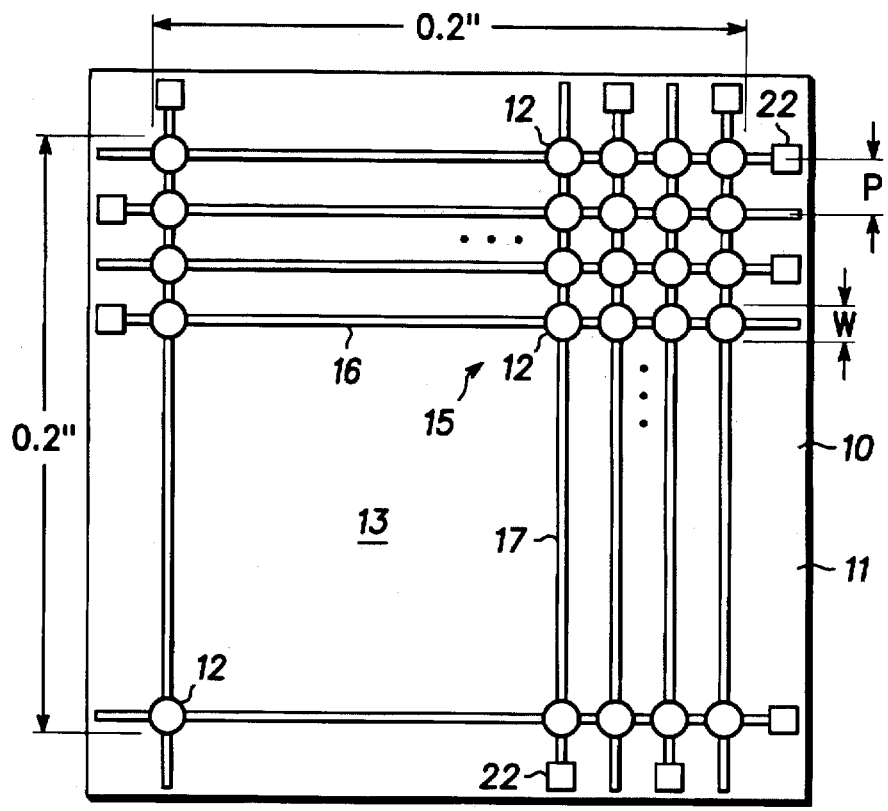
FIG. 1 is a greatly enlarged view in top plan of an array of light emitting devices formed on an optically transparent substrate.

During the course of this description, like numbers are used to identify like elements according to the different figures that illustrate the invention. Referring specifically to FIG. 1, a greatly enlarged view in top plan of a light emitting device display chip 14, in this embodiment comprised of an optically transparent substrate 10 having an array 15 of light emitting devices thereon is illustrated. For simplicity of illustration, only a representative portion of light emitting device display chip 14 and optically transparent substrate 10 has been completed. Optically transparent substrate 10 has a major surface 11 with a plurality of light emitting devices 12 formed thereon. Light emitting devices 12 are organic/ polymer electroluminescent elements or light emitting diodes. Hereinafter, for simplification of this disclosure, the term organic/polymer will be shortened to "organic". It should be understood that a wide variety of light emitting devices, including liquid crystal displays (LCDs), light emitting diodes (LEDs), surface emitting lasers, such as vertical cavity surface emitting lasers (VCSELs), field emission devices (FEDs), etc., can be utilized in light emitting device display chip 14 of the present invention, but light emitting diodes will be used throughout the description for simplicity. In this embodiment, each light emitting device 12 defines a pixel, with light emitting devices 12 positioned in rows and columns and cooperating to generate a complete image, when activated, at a central portion 13 of major surface 11. Each light emitting device 12 has a first electrode and a second electrode (discussed presently) to provide an activating potential.

Figure 2:
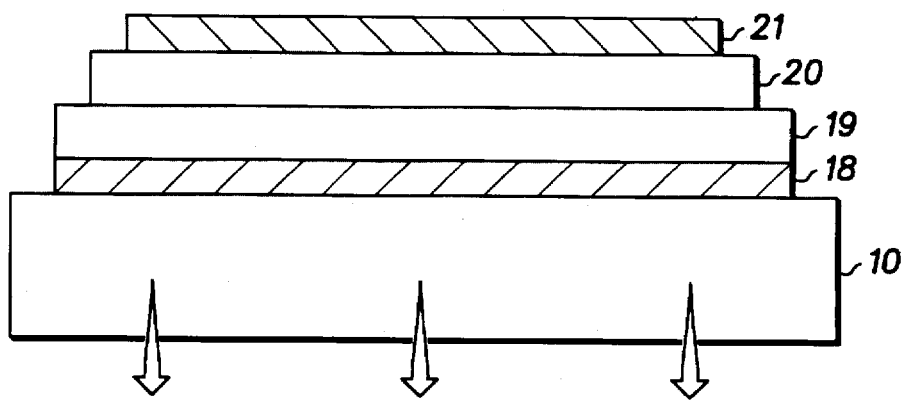
FIG. 2 is a simplified cross-sectional view of a single organic electroluminescent element on a glass substrate.

Referring specifically to FIG. 2, a simplified and greatly enlarged cross-sectional view of a light emitting device 12, which in this embodiment is a single organic electroluminescent element formed on an optically transparent substrate 10, which in this embodiment is glass, is illustrated. Light emitting device 12 includes a layer 18 of conductive material which serves as the anode of the diode or light emitting device 12 in this specific embodiment. An organic layer or layers 19/20 includes one or more layers of polymers or low molecular weight organic compounds. The organic materials that form the layers are chosen for their combination of electrical and luminescent properties, and various combinations of hole transporting, electron transporting, and luminescent materials can be used. In this embodiment, for example, layer 19 is a hole transport layer and layer 20 is a luminescent electron transport layer. A second layer 21 of conductive material is deposited on the upper surface of layers 19/20 and serves as the cathode in this specific embodiment.

Generally, either the anode or the cathode must be optically transparent to allow the emission of light therethrough. In this embodiment conductive layer 18 is formed of indium-tin oxide (ITO) which is optically transparent. In some applications a very thin metal film may be used as a transparent conductor instead of the ITO. Also, to reduce the potential required, the cathode is generally formed of a low work function metal/conductor or combination of metals/ conductors, at least one of which has a low work function. In this embodiment the cathode is formed of low work function material, such as heavily doped diamond, or the cathode may be a conductive metal incorporating cesium, calcium or the like. Light emitting device display chip 14 further has a plurality of external connection/mounting pads 22 adjacent outer edges thereof and outside of central portion 13 of major surface 11. As illustrated in FIG. 1, the first electrodes, e.g. the anodes, of light emitting devices 12 are connected to a first plurality of the external connection/ mounting pads 22, by a plurality of horizontal electrical conductors 16, to define rows of pixels, and the second electrodes, e.g. the cathodes, of light emitting devices 12 are connected to a second plurality of the external connection pads 22, by vertical electrical conductors 17 to define columns of pixels, thereby forming an addressable array 15 of light emitting devices 12.

A list of some possible examples of materials for the organic layer or layers 19/20 of the above described organic electroluminescent element as light emitting device 12 follows. As a single layer of polymer, some examples are: poly(p-phenylenevinylene) (PPV); poly(p-phenylene) (PPP); and poly[2-methoxy, 5-(2'-ethylhexoxy) 1,4-phenylenevinylene] (MEH-PPV). As an electron transporting electroluminescent layer between a hole transporting layer or one of the single layer polymers listed above and a low work function metal cathode, an example is:

8-hydroxquinoline aluminum (ALQ). As an electron transporting material, an example is: 2-(4-tert-butylphenyl)-5-(p-biphenylyl)-1,3,4-oxadiazole (butyl-PBD). As a hole transport material, some examples are: 4,4'-bis[N-phenyl-N-(3-methylphenyl)amino]biphenyl (TPD); and 1,1-bis(4-di-p-tolyaminophenyl)cyclohexane. As an example of a fluorescent that may be used as a single layer or as a dopant to an organic charge transporting layer is coumarin 540, and a wide variety of fluorescent dyes. Examples of low work function metals include: Mg:In, Ca, and Mg:Ag.

Light emitting devices 12 are formed on optically transparent substrate 10 in a central portion 13 of major surface 11 less than approximately 20 microns in diameter (W), in the embodiment illustrated approximately 10 microns in diameter. Also, the pitch, P, or spacing between centers of light emitting devices 12, is less than approximately 30 microns, and in the present embodiment is 20 microns. To completely distribute connection/mounting pads 22 around the periphery of light emitting device display chip 14, connection/mounting pads 22 are attached to alternate horizontal electrical conductors 16 and alternate vertical conductors 17. Thus, the space available between adjacent connection/mounting pads 22 is 2P, or in this specific embodiment 20 microns.

Figure 3:
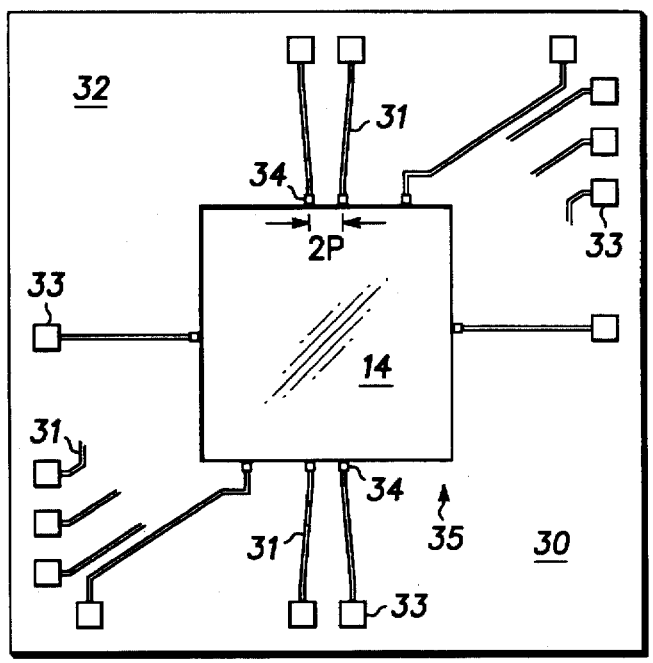
FIG. 3 is an enlarged view in top plan of a mounting substrate, having the light emitting device display chip mounted thereon, and including electrical connections.

Referring specifically to FIG. 3, an enlarged view in top plan of a mounting substrate 30, having a first major surface and a second opposed major surface, and having a central opening 35 defined therein, is illustrated. In the simplest embodiment, mounting substrate 30, having a central opening 35 defined therein, is formed of a planar piece of opaque material, such as molded plastic, ceramic or silicon material, having an additive, or more commonly known filler, added such as carbon, silica, feldspar, aluminum nitride, and/or any other commonly known filler used in the art to lower the coefficient of thermal expansion (CTE) of mounting substrate 30 to be close to the coefficient of thermal expansion (CTE) of light emitting device display chip 14. Central opening 35 is substantially the same size as array 15 of light emitting devices 12 so that the complete image generated by light emitting devices 12 in cooperation is completely visible therethrough when light emitting device display chip 14 is placed in register on mounting substrate 30. A plurality of mounting pads 34 are positioned around the periphery of central opening 35 on the first major surface of mounting substrate 30 so as to each contact a separate connection/mounting pad 22 on light emitting device display chip 14, when light emitting device display chip 14 is properly registered thereon. A plurality of electrical conductors 31 electrically connect the rows and columns of light emitting devices 12 through connection/mounting pads 22 and mounting pads 34 to a similar plurality of connection pads 33 positioned on the first major surface and around the outer periphery of mounting substrate 30.

The pitch of mounting pads 34 is equal to the 2P spacing of connection/mounting pads 22 on light emitting device display chip 14, so that each mounting pad 34 can be as large as P without causing electrical problems. Further, by fanning out electrical-conductors 31, connection pads 33 can be constructed large enough to provide easy electrical contact thereto. For example, if array 15 of light emitting devices 12 includes 40,000 devices (e.g., 200×200) and each device includes an area having a 10 micron diameter with a pitch P of 20 microns, then the area of the central portion 13 of optically transparent substrate 10 will be less than 0.2 inches on a side. Optically transparent substrate 10, in this specific embodiment, is constructed with a central portion 13 approximately 0.2 inches on a side and an outer periphery of 0.5 inches on a side. Thus, the 200 connection pads on each side of the periphery of mounting substrate 30 have approximately 60 microns of pitch available.

Figure 4:
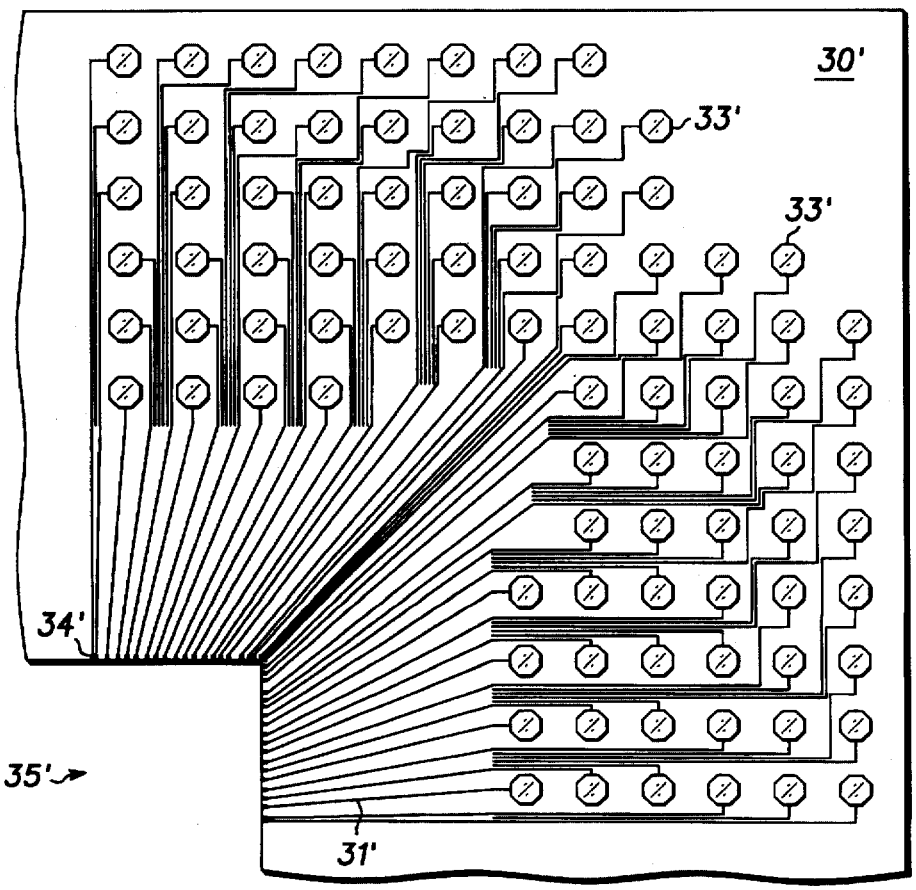
FIG. 4 is a greatly enlarged view in top plan of another embodiment of a mounting substrate, portions thereof broken away.

Referring specifically to FIG. 4, a greatly enlarged view in top plan of another embodiment of mounting substrate 30, referenced in this embodiment as 30', portions thereof broken away, is illustrated. In the embodiment of FIG. 4 portions that are similar to those described in conjunction with FIG. 3 are designated with similar numbers having a prime added to indicate the different embodiment. A central opening 35' is positioned to receive light emitting device display chip 14' thereon as described in conjunction with FIG. 3 and a plurality of electrical conductors 31' are positioned on the first major surface of mounting substrate 30' and are fanned out from the periphery of central opening 35' into contact with a plurality of connection pads 33'. Connection pads 33' are positioned in a matrix of rows and columns on the first major surface surrounding central opening 35'. Generally, it is anticipated that connection pads 33' can be positioned in the matrix with a pitch in the range of approximately 25 milli-inches to 50 milli-inches to allow sufficient space for electrical conductors 31' to extend therebetween as illustrated. For example, a matrix of connection pads 33' with a pitch of 40 milli-inches allows over 500 connection pads 33' on a one inch by one inch substrate with a central opening 35' of 0.2 inches by 0.4 inches.

Standard thin film metallization can be utilized, at least for electrical conductors 31 and connection pads 33, in which layers of metal are deposited by, for example, sputtering. In a typical metallization system, a first layer of chromium is applied by sputtering to operate as an adhesive layer on the glass. A second layer of copper is applied over the chromium to provide the desired electrical conduction and a layer of gold is applied over the copper to provide a barrier and adhesive layer for further connections. It should be understood that the metallization can be either an additive or subtractive method with the patterning and etching being performed by any of the various methods well known in the art to provide the desired final structure.

Further, in the instance in which mounting substrate 30 is formed of plastic, additive fillers such as carbon, silica, aluminum nitride, feldspar, and/or any other known filler commonly used in the art, may be utilized to lower the coefficient of thermal expansion (CTE) to be approximately the same coefficient of thermal expansion (CTE) as light emitting device display chip 14 so that when light emitting device display chip 14 is fixedly bonded to mounting substrate 30, changes in ambient temperature produce substantially the same amount of expansion or contraction and light emitting device display chip 14 is not damaged. It will of course be understood that minor differences in expansion/contraction can be tolerated if the amount of change between light emitting device display chip 14 and mounting substrate 30 are not large enough over the operating temperature range of the structure to damage light emitting device display chip 14.

Enlarged views, portions thereof broken away, of the relative positions of the components of an electro-optical package, three embodiments being disclosed herein, are illustrated in FIGS. 5, 6, and 7. An exploded view in perspective illustrating the relative positions of components of FIGS. 1 and 3 (or FIG. 4) and additional components included in the first embodiment of the electro-optical package is illustrated in FIG. 8.

Figure 8:
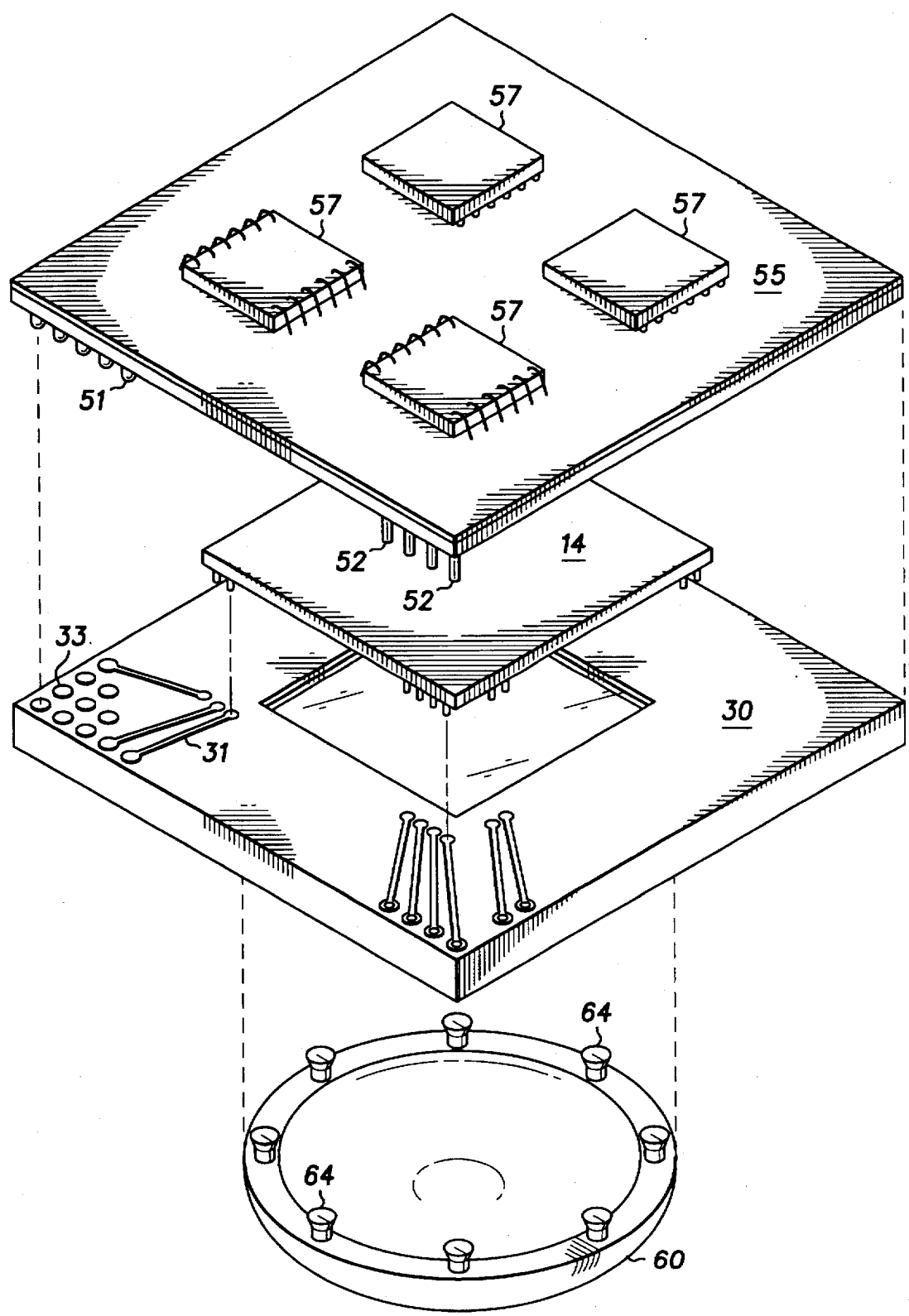
FIG. 8 is an exploded view in perspective illustrating the relative positions of the components of an electro-optical package, as illustrated in FIG. 5 in accordance with the present invention.

Referring now to FIGS. 5 and 8, a first embodiment of an electro-optical package 50 is illustrated. In the assembly process, light emitting device display chip 14 is inverted so that major surface 11 is down and connection/mounting pads 22 are positioned to each contact a separate mounting pad 34 (as shown in FIG. 3) on mounting substrate 30 when light emitting device display chip 14 is properly registered. Light emitting device display chip 14 has bumps 54 of contacting material deposited on connection/mounting pads 22 for electrically and physically connecting light emitting device display chip 14 to mounting substrate 30. Bumps 54 are formed of a material that is a relatively good electrical conductor and which can be at least partially melted and reset to form a good physical connection. Material which can be utilized for this purpose includes gold, copper, solder and especially high temperature solder, conducting epoxy, etc. A bump height of up to 80 microns can be formed on a square or round connection/mounting pad with a 20 micron diameter. For smaller pitches, 5 micron diameter copper bumps with a pitch of 10 microns have been formed with a bump height of 20 microns. Also, 15 micron diameter gold bumps on a 30 micron pitch have been formed to a height of 30 to 45 microns.

In one fabrication technique, light emitting device display chip 14 includes gold bumps and is thermo-compression bonded to mounting substrate 30. At the point where light emitting device display chip 14 is bonded to mounting substrate 30, light emitting display chip 14 can be easily tested and/or burned in prior to additional assembly of the package. This ability to provide an intermediate test point can be a substantial cost and time saving in the packaging procedure.

In addition to light emitting device display chip 14 and mounting substrate 30, this specific embodiment includes a mounting board or driver substrate 55 having a first major surface and a second opposed major surface, a plurality of driver and control circuits 57 are mounted on the first major surface thereof. Driver and control circuits 57 generally are formed as smaller integrated circuits which are wire bonded or bump bonded to electrical contacts on the first major surface of driver substrate 55. Driver substrate 55 is, for example, a convenient printed circuit board, such as FR4 or the like, and has either bumps 51 of contact material, such as C5 solder, solderable plated metal, or the like, or connecting pins 52 positioned on the second opposed major surface thereof. In some specific applications, driver substrate 55 could be a single semiconductor chip, having all of the driver and interconnect components integrated thereon. Because the pitch of connection pads 33 on mounting substrate 30 is (or can be) relatively large, relatively large bumps 51 or pins 52 can be utilized at this point.

The final additional component in electro-optical package 50 is an optical magnification system, which includes at least a lens 60 which is fabricated to overlie central opening 35 in mounting substrate 30 opposite light emitting device display chip 14 and driver substrate 55. Lens 60 is designed to serve as one element of the optical magnification system that magnifies the complete image generated by array 15 of light emitting devices 12 on optically transparent substrate 10 and produce an easily viewable virtual image. In this specific embodiment, lens 60 is affixed to the second major surface of mounting substrate 30 with a plurality of snap-fit protrusions 64, having cooperatively formed openings in mounting substrate 30, some convenient optically transparent epoxy, frictional engagement in central opening 35, or the like and is fabricated so as to axially align with central opening 35 of mounting substrate 30. In this embodiment lens 60 is provided having snap-fit protrusions 64 to allow for ease in the interchanging of lenses having various magnification and/or correction properties.

The interstice between mounting substrate 30, having light emitting device display chip 14 mounted thereon, and driver substrate 55 is filled with an underfill material 62, which may be any convenient material to provide support and make electro-optical package 50 a more robust package. Depending upon the material utilized in the formation of light emitting device display chip 14, comprised of array 15 of light emitting devices 12, a cavity (not shown) may be formed in driver substrate 55 to receive light emitting device display chip 14 and the edges of light emitting device display chip can be positioned sufficiently close to driver substrate 55 to act like an encapsulant dam so that the interstice between light emitting device display chip 14 and driver substrate 55 is left open or unfilled. Thus, light emitting device display chip 14 and driver substrate 55 are not physically attached together and different coefficients of expansion will have little or no effect. In some instances it may be convenient to encapsulate the interstices in electro-optical package 50 between lens 60 and light emitting device display chip 14 with an optically transparent material 63, such as an index matched gel or epoxy, if necessary, and in some instances it may be more convenient and less expensive to fill the interstices with different encapsulating material or leave unfilled as an air gap.

In either case, it should be understood that for best results optically transparent material 63 and lens 60 should be constructed with indices of refraction which are as close together as practical. If, for example, the index of refraction of optically transparent material 63 and lens 60 differs substantially there is a tendency for light to reflect at the interface back into light emitting device display chip 14 and the efficiency of electro-optical package 50 is reduced. Generally, an index of refraction of approximately 1.5 for optically transparent material 63 has been found to be acceptable.

Thus, an optically transparent substrate of glass or the like, such as optically transparent substrate 10, has the added advantage of providing additional environmental protection for array 15 of light emitting devices 12. Also, because opaque material, such as plastic, ceramic or silicon can be utilized for mounting substrate 30, having a coefficient of thermal expansion (CTE) which is the same as, or very close to the predetermined coefficient of thermal expansion (CTE) of the light emitting device display chip 14, substantial improvements in thermal cycling life are achieved with this embodiment.

An enlarged view similar to that of FIG. 5, of the components of FIG. 5 assembled into another embodiment of a complete electro-optical package 50' is illustrated in FIG. 6. In the embodiment of FIG. 6, portions that are similar to those described in conjunction with FIG. 5 are designated with similar numbers having a prime added to indicate the different embodiment. In this embodiment driver substrate 55' is formed having a central opening therethrough. The formation of the central opening allows for driver substrate 55' to be mounted on a side of mounting substrate 30' opposite the mounting of light emitting device display chip. 14', and on the same side as lens 60'. The complete image generated by light emitting device display chip 14' passes through central opening 35' in mounting substrate 30', through lens 60' and through the central opening formed in driver substrate 55'. In this particular embodiment, mounting substrate 30' has additionally formed therein a plurality of electrical connections, illustrated here as a plurality of embedded leadframes 43 and/or a plurality of plated through-hole vias 44 to electrically connect light emitting device display chip 14' with driver and control circuits 57'. Light emitting device display chip 14' has formed a protective overmolding 56, such as an overmolded pad array carrier (OMPAC), known in the art, to protect array 15 of light emitting devices 12 formed therein.

An enlarged view similar to that of FIGS. 5 and 6 of the components of FIGS. 5 and 6 assembled into another embodiment of a complete electro-optical package 50" is illustrated in FIG. 7. In the embodiment of FIG. 7, portions that are similar to those described in conjunction with FIGS. 5 and 6 are designated with similar numbers having a double prime added to indicate the different embodiment. In this embodiment mounting substrate 30" is formed of opaque silicon material having a plurality of patterned electrical interconnects or conductors 31 formed thereon. A driver substrate 55' is illustrated as being mounted on a side of mounting substrate 30" opposite the mounting of lens 60". Alternatively, driver substrate 55" can be formed having a central opening as described in conjunction with FIG. 6 and mounted on the same surface of mounting substrate 30" as lens 60". In this instance, mounting substrate 30" would have formed therein a plurality of embedded leadframes or plated through hole vias as described in conjunction with FIG. 6. Mounting substrate 30" is formed having a step recess onto which lens 60" is mounted. The use of an opaque silicon material to form mounting substrate 30" will aid in reducing the cost to manufacture the electro-optical package of the present invention.

Figure 11:
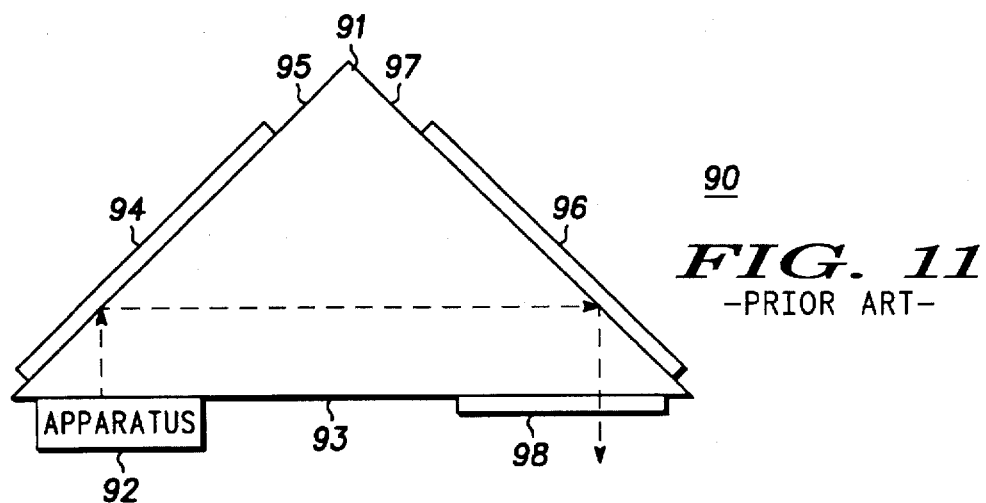

It should be understood that the complete image generated by the array 15 of light emitting devices 12 on optically transparent substrate 10 is too small to properly perceive (fully understand) with the human eye and generally requires a magnification of at least 10× for comfortable and complete viewing. Lens 60 can be a single lens with additional optical magnification supplied by an external system or lens 60 can include a complete magnification system. Further, lens 60 can be fabricated from glass, plastic or any other material or method well known to those skilled in the optical art. Also, in some applications lens 60 may be a complete external magnification system and may not be physically attached as a portion of electro-optical package 50. Several examples of optical magnification systems which may be incorporated into lens 60 or applied externally thereto are illustrated in FIGS. 9 through 11, explained below.

Referring to FIG. 9, a miniature virtual image display 70 is illustrated in a simplified schematic view. Miniature virtual image display 70 includes image generation apparatus 71, similar to the embodiments of electro-optical package 50 described above, for providing an image on a surface 72. An optical system, represented by lens system 73, is positioned in spaced relation to surface 72 of miniature virtual image display 70 and produces a virtual image viewable by an eye 77 spaced from an aperture 78 defined by lens system 73.

As technology reduces the size of the electro-optical package and/or the light generating devices contained within, greater magnification and smaller lens systems are required.

Lens system 73, represented schematically by a single lens, is mounted in spaced relation from surface 72 so as to receive the image from surface 72 and magnify it an additional predetermined amount. It will of course be understood that the lens system may be adjustable for focus and additional magnification, if desired, or may be fixed in a housing for simplicity.

Eye relief is the distance that eye 77 can be positioned from viewing aperture 78 and still properly view the image,
which distance is denoted by "d" in FIG. 9. Because of the size of lens system 73, eye relief, or the distance d, is sufficient to provide comfortable viewing and in the present embodiment is great enough to allow a viewer to wear normal eyeglasses, if desired. Because of the improved eye relief the operator can wear normal corrective lenses (personal eyeglasses), and the complexity of focusing and other adjustable features can be reduced, therefore, simplifying the construction of miniature virtual image display 70.

Referring to FIG. 10, another miniature virtual image display is illustrated in a simplified schematic. In waveguide virtual image display 80, image generation apparatus 81, similar to electro-optical package 50 described above, is affixed to the inlet of an optical waveguide 82 for providing an image thereto. Optical waveguide 82 is formed generally in the shape of a parallelogram (side view) with opposite sides, 83, 84 and 85, 86, equal and parallel but not perpendicular to adjacent sides. Side 83 defines the inlet and directs light rays from the image at image generation apparatus 81 onto a predetermined area on adjacent side 85 generally along an optical path defined by all four sides. Three diffractive lenses 87, 88 and 89 are positioned along adjacent sides 85, 84 and 86, respectively, at three predetermined areas and the magnified virtual image is viewable at an outlet in side 86. This particular embodiment illustrates a display in which the overall size is reduced somewhat and the amount of material in the waveguide is reduced to reduce weight and material utilized.

Referring to FIG. 11, another specific miniature virtual image display is illustrated in a simplified schematic. In waveguide virtual image display 90 an optical waveguide 91 having a generally triangular shape in side elevation is utilized. Image generation apparatus 92, similar to electro-optical package 50 described above, for producing an image, is affixed to a first side 93 of optical waveguide 91 and emanates light rays which travel along an optical path directly to a diffractive lens 94 affixed to a second side 95. Light rays are reflected from lens 94 to a diffractive lens 96 mounted on a third side 97. Diffractive lens 96 in turn reflects the light rays through a final refractive lens 98 affixed to the outlet of optical waveguide 91 in side 93, which refractive lens 98 defines a viewing aperture for waveguide virtual image display 90. In this particular embodiment the sides of waveguide virtual image display 90 are angularly positioned relative to each other so that light rays enter and leave the inlet and outlet, respectively, perpendicular thereto.

Figure 12:
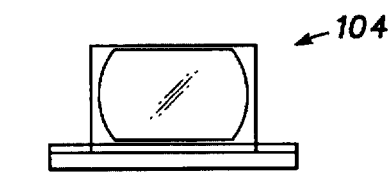
FIGS. 12, 13 and 14 illustrate a front view, side elevational view, and a top plan respectively, of an image manifestation apparatus utilizing the integrated electro-optical package of the present invention.
Figure 13:
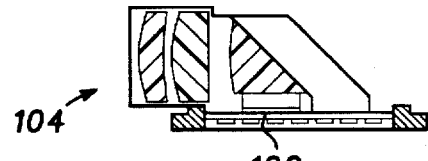
Figure 14:
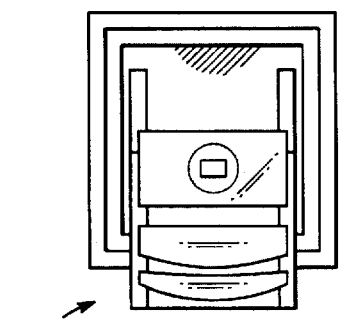

Referring now to FIGS. 12, 13 and 14, another miniature virtual image display 100 in accordance with the present invention, is illustrated in a front view, side elevational view, and top plan, respectively. FIGS. 12, 13 and 14 illustrate miniature virtual image display 100 approximately the actual size to provide an indication as to the extent of the reduction in size achieved by the present invention. Miniature virtual image display 100 includes an integrated electro-optical package 102 (generally similar to package, 50) which includes, in this specific embodiment, 144 pixels by 240 pixels. Each pixel is fabricated approximately 20 microns on a side with a center-to-center spacing between adjacent pixels of no more than 20 microns. In a preferred embodiment, integrated electro-optical package 102 produces a luminance less than approximately 15 fL. This very low luminance is possible because miniature virtual image display 100 produces a virtual image. Integrated electro-optical package 102 is mounted onto lens system 104, which magnifies the image approximately 15× to produce a virtual image approximately the size of an 8.5"×11" sheet of paper.

Here it should be noted that because integrated electro-optical package 102 is very small and the fact that a virtual image is utilized, rather than a direct view display, the overall physical dimensions of miniature virtual image display 100 are approximately 1.5 inches (3.8 cm) wide by 0.75 inches (1.8 cm) high by 1.75 inches (4.6 cm) deep, or a total volume of approximately 2 cubic inches (32 cm$^3$).

Figure 15:
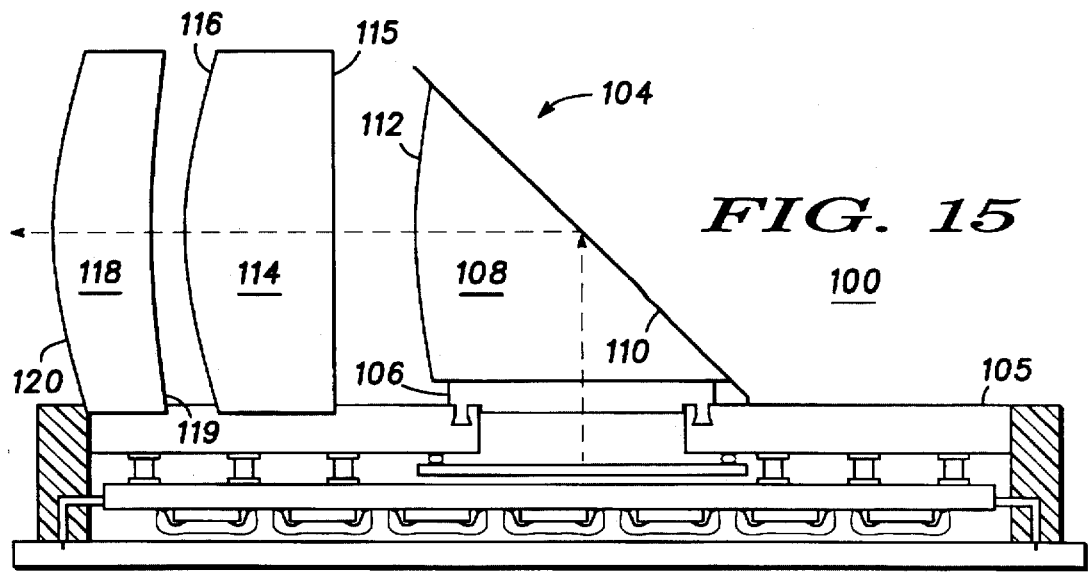
FIG. 15 is a 4x magnified view in side elevation of the apparatus of FIG. 12.

Referring specifically to FIG. 15, a 4× magnified view in side elevation of miniature virtual image display 100 of FIG. 12 is illustrated for clarity. From this view it can be seen that a first optical lens 106 (generally similar to lens 60) is affixed directly to the upper surface of an opaque mounting substrate 105 (generally similar to mounting substrate 30). An optical prism 108 is mounted to reflect the image from a surface 110 and from there through a refractive surface 112. The image is then directed to an optical lens 114 having a refractive inlet surface 115 and a refractive outlet surface 116. From optical lens 114 the image is directed to an optical lens 118 having an inlet refractive surface 119 and an outlet refractive surface 120. Also, in this embodiment at least one diffractive optical element is provided on one of the surfaces, e.g. surface 110 and/or refractive inlet surface 115, to correct for chromatic and other aberrations. The operator looks into outlet refractive surface 120 of optical lens 118 and sees a large, easily discernible virtual image which appears to be behind miniature virtual image display 100.

FIG. 16, illustrates an example of a portable electronic device, namely portable communications equipment, such as a portable communications receiver 130 having a data output terminal and a miniature virtual image display with viewing aperture. Illustrated in FIG. 16 is a hand held microphone 131 with a miniature virtual image display 132 mounted therein It will of course be understood that portable communications receiver 130 can be any of the well known portable receivers, such as a cordless or cellular telephone, a two-way radio, a pager, a data bank, etc. In the present embodiment, for purposes of explanation only, portable communications receiver 130 is a portable two-way police radio, generally the type carried by police officers on duty or security guards. Portable communications receiver 130 includes a control panel 134 for initiating calls and a standard visual display 136, if desired, for indicating the number called or the number calling. Hand held microphone 131 has a push-to-talk switch 138 and a voice pick-up 140.

Referring to FIG. 17, a simplified sectional view of hand held microphone 131, as seen from the line 17—17 of FIG. 16, is illustrated. Miniature virtual image display 132 includes an electro-optical package similar to electro-optical package 50, described above, having image generation apparatus 141 for providing an image to a fixed optical system 142, which in turn produces a virtual image viewable by the operator through an aperture 144. Fixed optical system 142 is constructed to magnify the entire image from image generation apparatus 141, without utilizing moving parts, so that the virtual image viewable through aperture 144 is a complete frame, or picture, which appears to be very large (generally the size of a printed page) and is easily discernible by the operator. The entire electro-optical package is relatively small and adds virtually no additional space requirements to hand held microphone 131. Optical system 142 is constructed with no moving parts, other than optional features such as focusing, zoom lenses, etc. Further, image generation apparatus 141 requires very little electrical power to generate the image and, therefore, adds very little to the power requirements of portable communications receiver 130.

Figure 18:
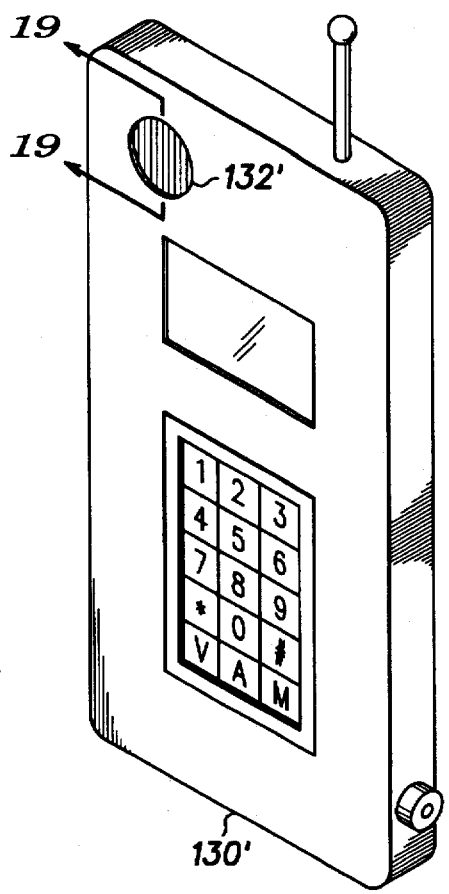
FIG. 18 is a view in perspective of another portable communications receiver incorporating the miniature virtual image display of FIG. 9.
Figure 19:
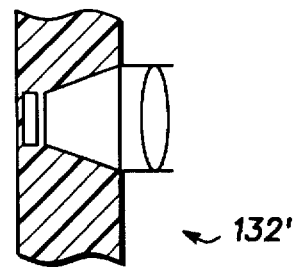
FIG. 19 is a simplified view generally as seen from the line 19—19 of FIG. 18.

Referring specifically to FIGS. 18 and 19, a second embodiment is illustrated wherein parts similar to those described in relation to FIGS. 16 and 17 are designated with similar numbers with a prime added to the numbers to indicate a different embodiment. In this embodiment a portable communications receiver 130' has a miniature virtual image display 132' included in the body thereof, instead of in a hand held microphone. A hand held microphone is optional and this specific embodiment is desirable for instances where a hand held microphone is not utilized or not available or for use in pagers and the like which do not transmit. Miniature virtual image display 132' is basically similar to miniature virtual image display 132 of FIGS. 16 and 17 and adds very little to the size, weight, or power consumption of portable communications receiver 130'.

Figure 20:
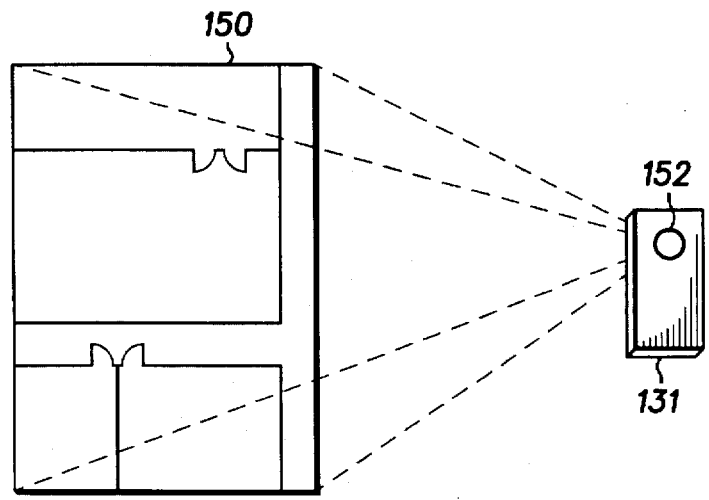
FIG. 20 is a view in perspective illustrating a typical view as seen by the operator of the portable communications receiver of FIG. 16.

FIG. 20 is a perspective view of hand held microphone 131 illustrating a typical view 150 seen by an operator looking into viewing aperture 152 of miniature virtual image display 132, described in conjunction with FIGS. 16 and 17. View 150 could be, for example, a floor plan of a building about to be entered by the operator (a policeman). In operation, the floor plan is on file at the police station and, when assistance is requested by the policeman, the station simply transmits video representative of the previously recorded plan. Similarly, miniature virtual image display 132 might be utilized to transmit pictures of missing persons or wanted criminals, maps, extremely long messages, etc. Many other variations, such as silent receiver operation wherein the message appears on miniature virtual image display 132 instead of audibly, are possible.

It should be noted that in the prior art, pagers and other small receivers in which visual displays are desired, are especially handicapped by the size of the displays. Generally such displays are limited to a single short line of text or several digits, and the size of the display still dictates the size of the receiver. Further, the display is clearer and easier to read and, because it utilizes a virtual display, requires very little power for the operation thereof. In fact, the present display utilizing the electro-optical package of the present invention uses much less power than any of the direct view displays normally utilized in electronic equipment and, as a result, can be fabricated in much smaller sizes.

In some applications, light emitting devices 12 and horizontal electrical conductors 16 and vertical electrical conductors 17 on optically transparent substrate 10 (FIG. 1) can be very small, micron or even sub-micron size, with the pitch, P, being too small to conveniently operably connect electrical conductors 31 and connection pads 33 thereto. In such applications the spacing between connection pads 33 can be increased by forming light emitting devices 12 into a push-pull array, as described U.S. Pat. No. 5,432,358, entitled "INTEGRATED ELECTRO-OPTICAL PACKAGE", issued Jul. 11, 1995 and incorporated herein by this reference.

Thus, the present invention illustrates and teaches integrated electro-optical packages which are not limited in size by the electrical connections and which are substantially smaller and more economical to manufacture than previous integrated packages which perform the same functions. Also, the present invention illustrates and teaches integrated electro-optical packages which contain cost effective materials to be utilized in the manufacturing process, are amenable to high volume production and easy to assemble.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An integrated electro-optical package comprising:

a light emitting device display chip comprised of an array of light emitting devices cooperating to generate a complete image, the light emitting devices being positioned in rows and columns to define all pixels of the complete image and operably connected to a plurality of external connection/mounting pads adjacent outer edges of the light emitting device display chip;

a mounting substrate defining a central opening therethrough substantially coextensive with the complete image generated by the light emitting device display chip and a plurality of mounting pads formed on a surface surrounding the central opening, the plurality of external connection/mounting pads on the light emitting device display chip being bump bonded to the plurality of mounting pads on the mounting substrate; and a plurality of driver and control circuits connected to the light emitting devices through a plurality of terminals and the plurality of mounting pads on the mounting substrate.

2. An integrated electro-optical package as claimed in claim 1 further comprising a lens system mounted to the mounting substrate over the central opening and on a side of the mounting substrate opposite the light emitting device display chip to receive and magnify the complete image and produce an easily viewable virtual image.

3. An integrated electro-optical package as claimed in claim 1 wherein the mounting substrate is formed of an opaque material.

4. An integrated electro-optical package as claimed in claim 3 wherein the light emitting device display chip has a predetermined coefficient of thermal expansion and the mounting substrate is formed of an opaque material having a coefficient of thermal expansion substantially similar to the coefficient of thermal expansion of the light emitting device display chip.

5. An integrated electro-optical package as claimed in claim 4 wherein the opaque material is one of plastic, ceramic and silicon.

6. An integrated electro-optical package as claimed in claim 5 wherein the opaque plastic has one of carbon, silica, feldspar, and aluminum nitride added thereto, to lower the coefficient of thermal expansion.

7. An integrated electro-optical package as claimed in claim 1 wherein the array of light emitting devices is positioned in a push-pull array.

8. An integrated electro-optical package as claimed in claim 1 wherein the light emitting devices include devices selected from the group including light emitting diodes, vertical cavity surface emitting lasers and field emission devices.

9. An integrated electro-optical package comprising:

a light emitting device display chip having a major surface with an array of light emitting devices formed on the major surface at a central portion thereof and cooperating to generate a complete image, each of the light emitting devices having a first electrode and a second electrode for activating the light emitting devices, the light emitting device display chip further having external connection/mounting pads adjacent outer edges thereof and outside of the central portion of the major surface with the first electrode of each of the light emitting devices being connected to one of a first plurality of the external connection/mounting pads and the second electrode of each of the light emitting devices being connected to one of a second plurality of the external connection/mounting pads;

a mounting substrate having a first major surface and a second opposed major surface and defining a central opening therethrough substantially coextensive with the complete image at the central portion of the major surface of the light emitting device display chip, the mounting substrate further having a plurality of electrical conductors formed therein, each extending from one of a plurality of mounting pads adjacent an edge of the central opening to one of a plurality of connection pads on the first major surface of the mounting substrate, the major surface of the light emitting device display chip being mounted on the first major surface of the mounting substrate with the first plurality of external connection/mounting pads and the second plurality of external connection/mounting pads being in electrical contact with the mounting pads of the mounting substrate and the complete image at the central portion of the major surface of the light emitting device display chip being axially aligned and coextensive with the central opening in the major surface of the mounting substrate;

a plurality of driver and controller circuits having data input terminals and further having control signal output terminals connected to the first electrode and the second electrode of each of the light emitting devices for activating the light emitting devices to generate complete images in accordance with data signals applied to the data input terminals; and a driver substrate having a first major surface and a second opposed major surface with first electrical connection pads on the first major surface, second electrical connection pads on the second opposed major surface and electrical connections formed in the driver substrate between the first and second electrical connection pads, the plurality of driver and controller circuits being mounted on the first major surface of the driver substrate with the control signal output terminals electrically contacting the first electrical connection pads, the driver substrate being mounted on one of the first major surface and the second opposed major surface of the mounting substrate with the second electrical connection pads of the driver substrate in electrical contact with the first and second pluralities of external connection/mounting pads of the light emitting device display chip.

10. An integrated electro-optical package as claimed in claim 9 including in addition an optical magnification system positioned adjacent the central opening in the mounting substrate for magnifying the complete image generated by the light emitting device display chip and producing a virtual image viewable by a human eye.

11. An integrated electro-optical package as claimed in claim 10 wherein the major surface of the light emitting device display chip is generally rectangular in shape and the size is less than approximately one inch on a side.

12. An integrated electro-optical package as claimed in claim 11 wherein the central portion of the major surface of the light emitting device display chip is generally rectangular in shape and the size is less than approximately one half inch on a side.

13. An integrated electro-optical package as claimed in claim 12 wherein the array of light emitting devices formed on the major surface at a central portion of the light emitting device display chip includes light emitting devices formed in an area of the major surface less than approximately 10 microns in diameter.

14. An integrated electro-optical package as claimed in claim 13 wherein the array of light emitting devices formed on the major surface at a central portion of the light emitting device display chip includes light emitting devices positioned in rows and columns with adjacent rows and adjacent columns being positioned less than approximately 30 microns apart.

15. An integrated electro-optical package as claimed in claim 14 wherein the plurality of electrical conductors formed on the first major surface of the mounting substrate are positioned to fan out from the mounting pads to the plurality of connection pads and the plurality of connection pads on the first major surface of the mounting substrate are positioned in rows and columns on the first major surface thereof.

16. An integrated electro-optical package as claimed in claim 15 wherein the plurality of connection pads on the first major surface of the mounting substrate are positioned in rows and columns on the first major surface thereof on a pitch of from approximately 25 to 50 mill-inches.

17. An integrated electro-optical package as claimed in claim 16 wherein the array of light emitting devices formed on the major surface of the light emitting device display chip include greater than approximately thirty thousand light emitting devices.

18. An integrated electro-optical package as claimed in claim 9 wherein the driver substrate has defined therein a central opening, substantially coextensive with the complete image at the central portion of the major surface of the light emitting device display chip.

19. An integrated electro-optical package comprising:

an optically transparent substrate having a major surface with a plurality of light emitting devices formed on the major surface, each of the light emitting devices having a first electrode and a second electrode for activating the light emitting devices, the light emitting devices defining a plurality of pixels positioned in rows and columns and cooperating to generate a complete image, when activated, at a central portion of the major surface, the optically transparent substrate further having external connection/mounting pads adjacent outer edges thereof and outside the central portion of the major surface with the first electrode of each of the light emitting devices being connected to a first plurality of the external connection/mounting pads defining rows of pixels and the second electrode of each of the light emitting devices being connected to one of a second plurality of the external connection/mounting pads defining columns of pixels;

a molded opaque mounting substrate having a first major surface and a second opposed major surface and defining a central opening therethrough substantially coextensive with the complete image at the central portion of the first major surface of the optically transparent substrate, the mounting substrate further having a plurality of electrical conductors formed therein, each extending from one of a plurality of mounting pads adjacent an edge of the central opening to one of a plurality of connection pads on the first major surface, the optically transparent substrate being mounted on the first major surface of the mounting substrate with the first and second pluralities of external connection/ mounting pads being in electrical contact with the mounting pads of the mounting substrate and the complete image at the central portion of the major surface of the optically transparent substrate being axially aligned and coextensive with the central opening in the major surface of the mounting substrate;

a plurality of driver and controller circuits having data input terminals and further having control signal output terminals adapted to be connected to the first and second terminals of the light emitting devices for activating the light emitting devices to generate complete images in accordance with data signals applied to the data input terminals; and a driver substrate having first major surface and a second opposed major surface with first electrical connection pads on the first major surface, second electrical connection pads on the second opposed major surface and electrical connections formed in the driver substrate between the first and second electrical connection pads, the plurality of driver and controller circuits being mounted on the first major surface of the driver substrate with the control signal output terminals electrically contacting the first electrical connection pads, the mounting substrate being mounted on the second opposed major surface of the driver substrate with the second electrical connection pads in electrical contact with the first and second pluralities of external connection/mounting pads on the optically transparent substrate.

20. An integrated electro-optical package as claimed in claim 19 including an optical lens mounted on the second opposed major surface of the mounting substrate, substantially coextensive the central opening of the mounting substrate.

21. An integrated electro-optical package as claimed in claim 20 wherein the optical lens mounted to the mounting substrate is mounted with one of a plurality of snap-fit protrusions and cooperating voids, an optically transparent epoxy, and a frictional engagement with the central opening of the mounting substrate.

22. An integrated electro-optical package as claimed in claim 19 wherein the optically transparent substrate has a predetermined coefficient of thermal expansion and the mounting substrate is formed having a coefficient of thermal expansion substantially similar to the coefficient of thermal expansion of the optically transparent substrate.

23. An integrated electro-optical package as claimed in claim 22 wherein the molded opaque mounting substrate is formed from one of plastic, ceramic and silicon.

24. An integrated electro-optical package as claimed in claim 23 wherein the plastic has added, a filler comprised of one of carbon, silica, feldspar and aluminum nitride.

25. An integrated electro-optical package as claimed in claim 19 wherein the mounting substrate has formed therein a plurality of electrical conductors extending from the plurality of connection pads on the first major surface to a plurality of connection pads on the second major surface, the electrical conductors being one of embedded leadframes and plated through-hole vias.

26. An integrated electro-optical package as claimed in claim 25 wherein the driver substrate is mounted on the first major surface of the mounting substrate.

27. An integrated electro-optical package as claimed in claim 25 wherein the driver substrate is mounted on the second major surface of the mounting substrate, and having defined therein a central opening substantially coextensive the complete image generated by the plurality of light emitting devices.

28. An integrated electro-optical package as claimed in claim 19 wherein the plurality of light emitting devices includes a plurality of organic electroluminescent elements.

29. An integrated electro-optical package as claimed in claim 28 wherein the plurality of organic electroluminescent elements each include a first conductive layer positioned on a major surface of the optically transparent substrate, at least one layer of organic material positioned on the first conductive layer, and a second conductive layer positioned on the at least one layer of organic material.

30. An integrated electro-optical package as claimed in claim 29 wherein the first conductive layer on the major surface of the optically transparent substrate includes a layer of indium-tin oxide.

31. An integrated electro-optical package as claimed in claim 29 wherein the at least one layer of organic material on the first conductive layer includes one of a layer of polymer and a layer of low molecular weight organic compound.

32. A portable electronic device with visual display comprising:

a portable electronic device having a data output terminal; and a miniature virtual image display having a viewing aperture, the display being operably attached to a receiver and including an optically transparent substrate having a major surface with a plurality of light emitting devices formed on the major surface, each of the light emitting devices having first and second electrodes for activating the light emitting devices, the light emitting devices defining a plurality of pixels positioned in rows and columns and cooperating to generate a complete image, when activated, at a central portion of the major surface, the optically transparent substrate further having external connection pads adjacent outer edges thereof and outside of the central portion of the major surface with the first electrodes of the light emitting devices being connected to a first plurality of the external connection pads defining rows of pixels and the second electrodes of the light emitting devices being connected to a second plurality of the external connection pads defining columns of pixels;

a plurality of driver and controller circuits having data input terminals connected to the data output terminal of the electronic device and further having control signal output terminals adapted to be connected to the first and second terminals of the light emitting devices for activating the light emitting devices to generate complete images in accordance with data signals applied to the data input terminals;

a mounting substrate defining a central opening therethrough substantially coextensive with the complete image generated by the light emitting devices and a plurality of mounting pads formed on a surface surrounding the central opening, the plurality of external connection/mounting pads on the optically transparent substrate being bump bonded to the plurality of mounting pads on the mounting substrate;

a driver substrate having first and second opposed major surfaces with first electrical connection pads on the first major surface, second electrical connection pads on the second opposed major surface and electrical connections formed in the driver substrate between the first and second electrical connection pads, the mounting substrate being mounted on the first major surface of the driver substrate with the first electrical connection pads in electrical contact with the first and second pluralities of external connection pads on the optically transparent substrate, and the plurality of driver and controller circuits being mounted on the second opposed major surface of the driver substrate with the control signal output terminals electrically contacting the second electrical connection pads; and an optical magnification system mounted in the electronic device and axially aligned with the central portion of the optically transparent substrate for defining the aperture and providing a virtual image from the complete image generated by the plurality of light emitting devices, the virtual image being easily viewable by an operator of the electronic device.

33. A portable electronic device with visual display as claimed in claim 32 wherein the plurality of light emitting devices on the major surface of the optically transparent substrate include a plurality of light emitting devices on a glass substrate.

34. A portable electronic device with visual display as claimed in claim 33 wherein the plurality of light emitting devices on the major surface of the optically transparent substrate include organic electroluminescent elements on the glass substrate.

35. A portable electronic device with visual display as claimed in claim 32 wherein the optical magnification system is designed to magnify the complete image generated by the plurality of light emitting devices and produce a virtual image perceivable by a human eye.

36. A portable electronic device with visual display as claimed in claim 32 wherein the mounting substrate is formed of an opaque material.

37. A portable electronic device with visual display as claimed in claim 36 wherein the optically transparent substrate has a predetermined coefficient of thermal expansion and the mounting substrate is formed of an opaque material having a coefficient of thermal expansion substantially similar to the coefficient of thermal expansion of the optically transparent substrate.

38. A portable electronic device with visual display as claimed in claim 32 wherein the portable electronic device includes portable communications equipment.

39. A portable electronic device with visual display as claimed in claim 38 wherein the portable communications equipment is one of a cellular telephone, a two-way radio, a data bank and a pager.

40. A method of fabricating an electro-optical package comprising the steps of:

forming a plurality of light emitting devices on a major surface of an optically transparent substrate, each of the light emitting devices having first and second electrodes for activating the light emitting devices, the light emitting devices defining a plurality of pixels positioned in rows and columns and cooperating to generate a complete image, when activated, at a central portion of the major surface, the optically transparent substrate further being formed with external connection pads adjacent outer edges thereof and outside of the central portion of the major surface with the first electrodes of the light emitting devices being connected to a first plurality of the external connection pads defining rows of pixels and the second electrodes of the light emitting devices being connected to a second plurality of the external connection pads defining columns of pixels;

forming an opaque mounting substrate having a first major surface and a second opposed major surface and defining a central opening therethrough substantially coextensive with the complete image generated by the light emitting devices, forming a plurality of mounting pads on the first major surface surrounding the central opening and a plurality of connection pads on the first major surface about a periphery of the mounting substrate, forming a plurality of electrical conductors extending therebetween;

mounting the major surface of the optically transparent substrate on the first major surface of the mounting substrate with the first and second pluralities of external connection/mounting pads of the optically transparent substrate being in electrical contact with the plurality of mounting pads of the mounting substrate and the complete image at the central portion of the optically transparent substrate being axially aligned with the central opening in the mounting substrate;

forming a plurality of driver and controller circuits having data input terminals and further having control signal output terminals adapted to be connected to the first and second electrodes of the light emitting devices for activating the light emitting devices to generate complete images in accordance with data signals applied to the data input terminals;

forming a driver substrate with first and second opposed major surfaces and forming first electrical connection pads on the first major surface, second electrical connection pads on the second major surface and electrical connections in the driver substrate between the first and second electrical connection pads;

mounting the plurality of driver and controller circuits on the first major surface of the driver substrate with the control signal output terminals electrically contacting the first electrical connection pads; and mounting the driver substrate on one of the first major surface and the second major surface of the mounting substrate, with the second electrical connection pads of the driver substrate contacting the plurality of connection pads of the mounting substrate.

41. A method of fabricating an electro-optical package as claimed in claim 40 wherein the step of forming a mounting substrate with a plurality of mounting pads and a plurality of connection pads on the first major surface thereof and a plurality of electrical conductors extending therebetween includes the step of forming the plurality of mounting pads, the plurality of connection pads, and the plurality of electrical conductors with one of mounting bumps, mounting pins, patterned electrical interconnects, embedded leadframes, and plated through-hole vias.

42. A method of fabricating an electro-optical package as claimed in claim 40 wherein the step of forming a driver substrate with first electrical connection pads on the first major surface thereof and second electrical connection pads on the second major surface thereof includes the step of forming the first electrical connection pads and the second electrical connection pads with one of mounting bumps, mounting pins, embedded leadframes, and plated through-hole vias.

43. A method of fabricating an electro-optical package as claimed in claim 40 wherein the step of forming a plurality of light emitting devices on the major surface of an optically transparent substrate includes forming a plurality of light emitting devices on a glass substrate.

44. A method of fabricating an electro-optical package as claimed in claim 43 wherein the step of forming a plurality of light emitting devices on the major surface of an optically transparent substrate includes forming organic electroluminescent elements on the glass substrate.

45. A method of fabricating an electro-optical package as claimed in claim 40 wherein the step of forming a mounting substrate having a first major surface and a second opposed major surface includes providing a piece of planar opaque material and defining a central opening therethrough.

46. A method of fabricating an electro-optical package as claimed in claim 45 wherein the step of forming a plurality of light emitting devices on the major surface of the optically transparent substrate includes selecting the optically transparent substrate with a predetermined coefficient of thermal expansion and the step of providing a piece of planar opaque material includes selecting the material with a temperature coefficient substantially similar to the temperature coefficient of the optically transparent substrate.

* * * * *